United States Patent [19]
Ogushi

[11] Patent Number: 6,160,865
[45] Date of Patent: *Dec. 12, 2000

[54] X-RAY EXPOSURE APPARATUS WITH SYNCHROTRON RADIATION INTENSITY MEASUREMENT

[75] Inventor: Nobuaki Ogushi, Utsunomiya, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/057,506

[22] Filed: Apr. 9, 1998

[30] Foreign Application Priority Data

Apr. 11, 1997 [JP] Japan .................................. 9-110488

[51] Int. Cl.⁷ ....................................................... G21K 5/00
[52] U.S. Cl. .............................................. 378/34; 378/207
[58] Field of Search ................................ 378/34, 35, 205, 378/207

[56] References Cited

U.S. PATENT DOCUMENTS

| | | | |
|---|---|---|---|
| 5,159,621 | 10/1992 | Watanabe et al. | 161/161 |
| 5,195,113 | 3/1993 | Kuwabara | 378/34 |
| 5,285,488 | 2/1994 | Watanabe et al. | 378/34 |
| 5,448,612 | 9/1995 | Kasumi et al. | 378/84 |

*Primary Examiner*—David P. Porta
*Attorney, Agent, or Firm*—Fitzpatrick, Cella, Harper & Scinto

[57] ABSTRACT

A synchrotron radiation measuring system includes an X-ray detector movable in a direction of intensity distribution of synchrotron radiation to follow shift of the synchrotron radiation, and a computing device for reserving therein one of (i) a relation between a signal of the X-ray detector and the intensity of synchrotron radiation and (ii) a relation among a signal of the X-ray detector, the level of vacuum at a synchrotron ring and the intensity of synchrotron radiation, wherein the intensity of synchrotron radiation is measured through the computing device on the basis of an output signal of the X-ray detector.

8 Claims, 5 Drawing Sheets

X-RAY EXPOSURE APPARATUS WITH SYNCHROTRON RADIATION INTENSITY MEASUREMENT

FIELD OF THE INVENTION AND RELATED ART

This invention relates to a synchrotron radiation intensity measuring system for measuring the intensity of synchrotron radiation and also to an X-ray exposure apparatus wherein the exposure amount is controlled on the basis of measurement by such measuring system. In another aspect, the invention is concerned with a device manufacturing method which uses such exposure apparatus.

In X-ray exposure apparatuses for use in an X-ray lithographic process in one field of use of synchrotron radiation, since the synchrotron radiation has a shape of sheet-like beam and sufficient exposure region is not provided, an X-ray mirror is used to expand the sheet-like beam in a direction perpendicular to the synchrotron orbit. It is an important factor to maintain uniform exposure amount upon the surface of a substrate such as a wafer, irradiated thereby. To this end, it is required to precisely control the attitude of or relative position of the X-ray mirror with respect to the sheet-like beam, emitted from a synchrotron ring. Further, if during the X-ray exposure process the relative positional relation between the X-ray mirror and the sheet-like beam varies due to vibration, temperature change or fluctuation of the sheet-like beam, uniformness of exposure amount can not be retained, and non-uniform exposure results. In consideration of this, it is desired that the synchrotron ring, the X-ray mirror and the X-ray exposure apparatus are mounted very precisely. Additionally, use of some mechanism for cancelling any external vibration is desired.

U.S. Pat. No. 5,448,612 shows an apparatus wherein a beam position detector is provided on a support member for an X-ray mirror to detect relative positional deviation of the X-ray mirror relative to the beam. Driving means controls the attitude of the X-ray mirror on the basis of the result of detection by the detector. A dual-element detector disposed in a vertical direction are used to control the attitude of an X-ray mirror so that the outputs of the detector elements are balanced. Also, on the basis of the sum signal of the outputs of the two detector elements or of an output of one of them, the intensity of synchrotron radiation is calculated.

Although in the above-described example the intensity of synchrotron radiation can be calculated on the basis of an output signal of a detector, if the intensity distribution in a direction perpendicular to the synchrotron radiation varies as a result of a change in accumulated current of a synchrotron ring, for example, the intensity of synchrotron radiation and the output signal of the detector are not exactly proportionally correlated with each other. Thus, in that occasion, an error occurs in calculation of the synchrotron radiation intensity. If the exposure amount is controlled on the basis of it, there may occur an error in exposure amount.

SUMMARY OF THE INVENTION

It is an object of the present invention to provide a synchrotron radiation intensity measuring system by which the intensity of synchrotron radiation can be measured precisely and quickly with simple procedure.

It is another object of the present invention to provide an X-ray exposure apparatus by which exposure amount can be controlled precisely on the basis of measurement made by use of such intensity measuring system.

In accordance with an aspect of the present invention, there is provided a synchrotron radiation measuring system, comprising: an X-ray detector movable in a direction of intensity distribution of synchrotron radiation to follow shift of the synchrotron radiation; and computing means for reserving therein one of (i) a relation between a signal of said X-ray detector and the intensity of synchrotron radiation and (ii) a relation among a signal of said X-ray detector, the level of vacuum at a synchrotron ring and the intensity of synchrotron radiation; wherein the intensity of synchrotron radiation is measured through said computing means on the basis of an output signal of said X-ray detector.

In one preferred form of this aspect of the present invention, said computing means reserves therein a relation between a signal of said X-ray detector and the intensity of synchrotron radiation, and, when the intensity of synchrotron radiation is I and the output of said X-ray detector is v, the relation satisfies a condition:

$$I(v) = a_0 + a_1 v + a_2 v^2 + a_3 v^3 + \ldots$$

In another preferred form of this aspect of the present invention, said computing means reserves therein a relation among a signal of said X-ray detector, the level of vacuum at the synchrotron ring and the intensity of synchrotron radiation, and, when the intensity of synchrotron radiation is I and the output of said X-ray detector is v, the relation satisfies a condition:

$$I(v) = a_0(p) + a_1(p)v + a_2(p)v^2 + a_3(p)v^3 + \ldots$$

where $a_0, a_1, a_3, \ldots$, are coefficients which are a function of vacuum level p of the synchrotron ring.

In a further preferred form of this aspect of the present invention, said X-ray detector has two elements which are disposed in array along the direction of intensity distribution of the synchrotron radiation.

In accordance with another aspect of the present invention, there is provided an X-ray exposure apparatus, comprising: a synchrotron radiation intensity measuring system as recited above; and control means for controlling exposure amount on the basis of measurement by said measuring system.

In one preferred form of this aspect of the present invention, said control means comprises means for controlling exposure time.

In another preferred form of this aspect of the present invention, said exposure time controlling means comprises shutter control means for controlling a driving speed or a driving pattern for a shutter thereby to control the exposure time.

Use of computing means which reserves therein one of (i) a relation between a signal of said X-ray detector and the intensity of synchrotron radiation and (ii) a relation among a signal of said X-ray detector, the level of vacuum at a synchrotron ring and the intensity of synchrotron radiation, enables high precision and high speed calculation of the intensity of synchrotron radiation on the basis of an output of the X-ray detector which detects a sheet-like beam of synchrotron radiation.

Further, because of capability of high precision and high speed calculation of synchrotron radiation intensity, exposure time can be controlled through control of a driving speed or driving pattern for a shutter on the basis of the result of calculation. Thus, high precision exposure amount control is assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A and 5B are graphs for explaining shutter drive, wherein FIG. 5A shows intensity distribution of enlarged beam upon a mask, and FIG. 5B shows exposure time with respect to the position in Y direction, for obtaining uniform exposure amount.

DESCRIPTION OF THE PREFERRED EMBODIMENTS

Preferred embodiments of the present invention will be described in conjunction with the drawings.

Figure 1:
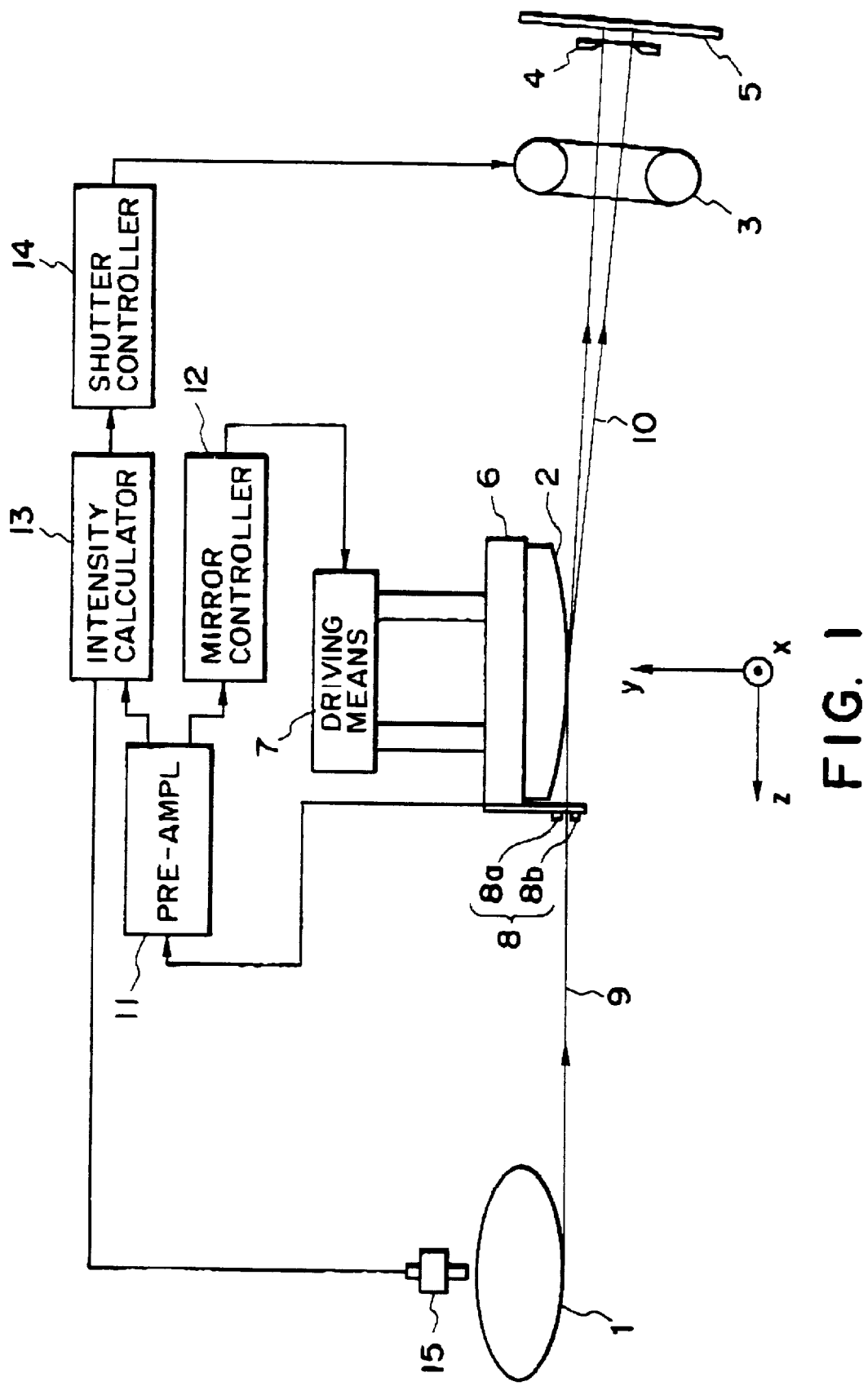
FIG. 1 is a schematic and diagrammatic view of a synchrotron radiation intensity measuring system and an X-ray exposure apparatus, according to an embodiment of the present invention.

FIG. 1 is a schematic view of a synchrotron radiation intensity measuring system and an X-ray exposure apparatus, according to an embodiment of the present invention. In FIG. 1, denoted at 1 is a synchrotron ring which is a light source for producing synchrotron radiation light and which emits a sheet-like beam 9. The level of vacuum of the synchrotron ring 1 is monitored by use of a pressure sensor 15. The sheet-like beam 9 is expanded by a cylindrical mirror 2 in Y direction, such that an exposure picture angle upon a mask 4 is assured. The expanded beam 10 has an intensity distribution along the Y direction. In order to cancel this Y-direction intensity distribution with respect to exposure time so as to provide uniform exposure amount upon the mask 4 and upon a wafer 5, a stutter 3 is drive controlled to adjust the movement speed thereof in accordance with the intensity distribution.

As regards the positional relation between the cylindrical mirror 2 and the sheet-like beam 9, the mirror 2 and the beam 9 should be precisely registered with each other. Further, the cylindrical mirror 2 needs to move in Y direction to follow vibration or shift of the sheet-like beam 9. To this end, the cylindrical mirror 2 is mounted on a mirror holder 6 which can be driven in Y direction by driving means 7. Additionally, mounted on the mirror holder 6 is dual-element detector means having first and second X-ray detectors 8a and 8b each for detecting a beam within a predetermined region in the neighborhood of the upper or lower edge of the sheet-like beam 9. Outputs of the first and second X-ray detectors 8a and 8b are amplified by a preamplifier 11, and the thus amplified outputs Va and Vb of the first and second X-ray detectors 8a and 8b are transmitted to a mirror controller 12 and an intensity computing device 13. The mirror controller 12 compares the amplified outputs Va and Vb of the X-ray detectors 8a and 8b with each other, and it supplies a drive signal to the driving means 7 in accordance with the result of comparison. Thus, the mirror controller 12 drives the driving means 7 on the basis of the result of comparison between the outputs Va and Vb, and it moves the cylindrical mirror 2 so that the outputs Va and Vb become equal to each other. In this manner, the mirror controller 12 controls the position of the cylindrical mirror 2 and registers the mirror 2 and the sheet-like beam 9 with each other very precisely. Further, the intensity computing means 13 converts a sum signal of the amplified outputs Va and Vb of the first and second X-ray detectors 8a and 8b into exposure light intensity. On the basis of the thus provided exposure light intensity, a shutter controller 14 calculates a driving time for a shutter 3. Then, the controller 14 drives the shutter 3 in accordance with the result of calculation. In this manner, the movement speed of the shutter 3 is controlled in accordance with exposure light intensity, whereby uniform exposure amount is assured upon a mask 4 and a wafer 5, as described hereinbefore.

Figure 2:
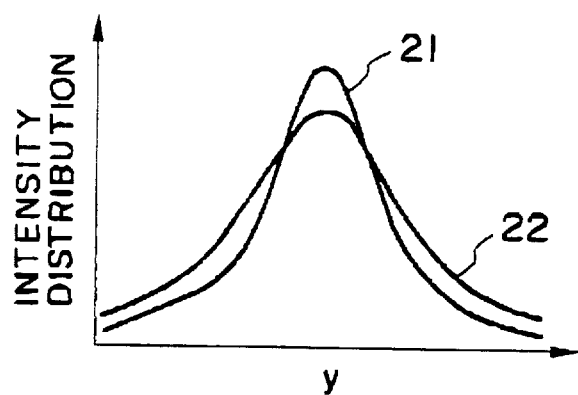
FIG. 2 is a graph for explaining changes in beam profile of synchrotron radiation light.
Figure 3:
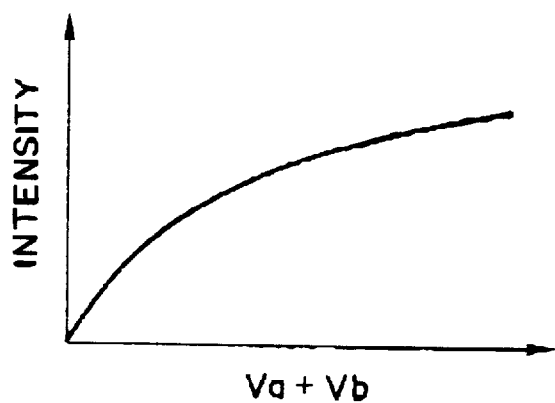
FIG. 3 is a graph for explaining the relation between a sum signal of X-ray detector outputs and the intensity of exposure light.

In the synchrotron ring 1, if the accumulated current value or the vacuum level thereof varies, the beam profile of synchrotron radiation light changes. Such change in beam profile results in that the sum signal of outputs Va and Vb of the first and second X-ray detectors 8a and 8b goes out of exact proportional relation with the exposure light intensity. Thus, in that occasion, the exposure light intensity can not be calculated with good precision. More specifically, when the accumulated current value of the synchrotron ring 1 is small, as shown at 21 in FIG. 2 the beam profile has a small expansion; whereas when the accumulated current value is large, the beam profile has a large expansion. Thus, the relation between the sum signal of outputs Va and Vb of the first and second X-ray detectors 8a and 8b has a tendency such as shown in FIG. 3. It is not a straight line passing an origin. In consideration of the above, such tendency characteristics are memorized in the intensity computing means 13 beforehand in the form of a data table. Then, the data table in the intensity computing means 13 is referred to, on the basis of a sum signal of outputs Va and Vb of the X-ray detectors 8a and 8b. This enables high precision and high speed calculation of exposure light intensity.

The characteristics such as shown in FIG. 3 which are to be reserved in the data table can be represented by the following relation:

$$I(v)=a_0+a_1 v+a_2 v^2+a_3 v^3+\ldots \qquad (1)$$

where I is the intensity of synchrotron radiation light and v is the output of X-ray detector.

Further, it is known that the beam profile of synchrotron radiation varies with the pressure of the synchrotron ring 1. In consideration of this, the output of the pressure sensor 15 for monitoring the pressure of the synchrotron ring 1 is supplied into the intensity computing means 13, and correction is made to the coefficients. This enables higher precision calculation of exposure light intensity. Here, since coefficients $a_0, a_1, a_2, a_3, \ldots$, in equation (1) above are functions of vacuum level p of the synchrotron ring, the relation among them can be expressed by:

$$I(v)=a_0(p)+a_1(p)v+a_2(p)v^2+a_3(p)v^3+\ldots \qquad (2)$$

Figure 4:
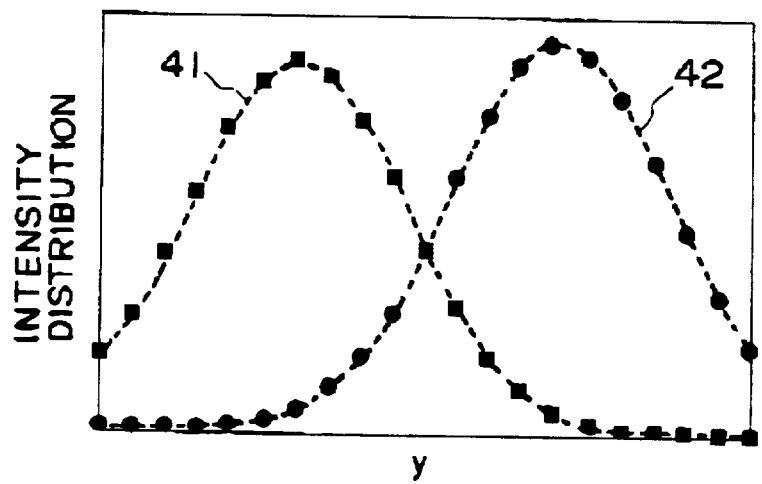
FIG. 4 is a graph for explaining measurement of beam profile.

The procedure of measurement of data table such as shown in FIG. 3 will now be explained. FIG. 4 is a graph wherein outputs of X-ray detectors 8a and 8b as the cylindrical mirror 2 is moved in Y direction by the driving means 7 are plotted, and the beam profile of the sheet-like beam 9 is measured. Denoted at 41 corresponds to a curve Va(y), and denoted at 42 is a curve Vb(y). These curves are Gauss approximated, and voltage and area at the intersection are detected. The area has a value proportional to the exposure light intensity, and a conversion coefficient may be determined beforehand on the basis of the sensitivity of the X-ray detector 8, for example. This operation is performed while changing the accumulated current of the synchrotron ring 1, and plural data pieces are obtained. Then, the voltages and exposure light intensities are plotted, and an approximation curve is determined. The coefficient associated therewith is memorized into the intensity computing means 13. Further, changes in coefficient as the vacuum level of the synchrotron ring 1 varies are detected as plural data pieces, and they are stored in the form of a function. This enables high precision measurement.

Figure 5A:
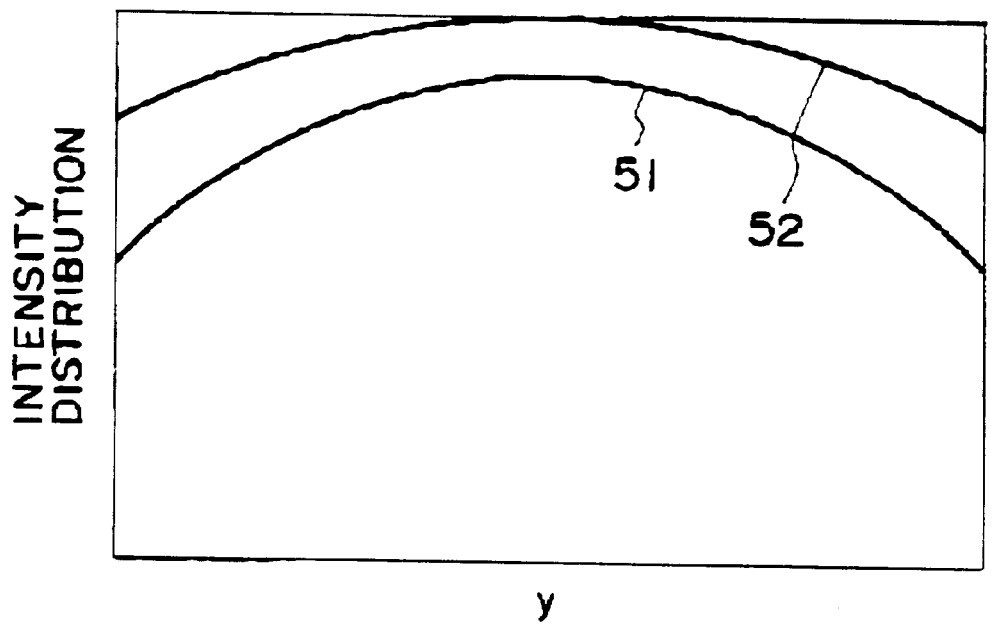
Figure 5B:
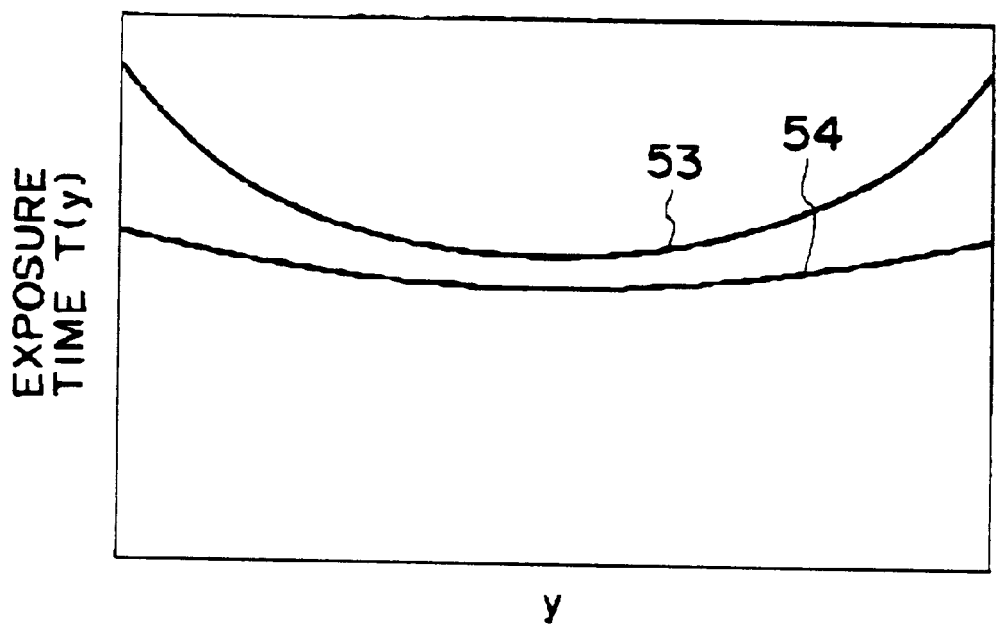

Another embodiment of the present invention will now be described. This embodiment has a basic structure which is similar to that of the preceding embodiment. However, in this embodiment, the driving speed of a shutter as well as the driving speed thereof are controlled and changed in response to an output of the intensity computing means 13 and in accordance with the beam profile of the synchrotron radiation light, by which further enhancement of precision of exposure amount control is assured. FIG. 5A shows intensity distribution, upon a mask 4, of enlarged beam 10 being enlarged by the cylindrical mirror 2 in Y direction. Here, a curve 51 corresponds to the intensity distribution as the accumulated current of the synchrotron ring is small. Curve 52 corresponds to the intensity distribution when the accumulated current is large. It is seen that the beam is expanded with enlargement of accumulated current. In consideration of this, in order to correct this intensity distribution, the drive of shutter 3 is so controlled as to cancel the intensity distribution with respect to exposure time, in accordance with the position in Y direction, to thereby provide uniform exposure amount on the mask 4. More specifically, it can be accomplished by changing the speed of an aperture of the shutter 3, passing the beam path. In FIG. 5B, curves 53 and 54 depict exposure times at different positions in Y direction, corresponding to the intensity distributions 51 and 52, respectively. To provide them, the shutter controller 14 calculates the profile of expanded beam on the basis of an output of the intensity computing means 13, and the shutter 13 is driven in accordance with the calculation. For calculation of profile, the expanded beam as reflected by the cylindrical mirror 2 may be determined by calculation or, alternatively, exposure experiments may be made while changing the current value and it may be determined from the rate of resist remaining on the wafer 5.

While in the above-described embodiments a cylindrical mirror is used to enlarge the exposure picture angle, substantially the same advantageous results are or curse attainable with a case wherein a plane mirror is oscillated to expand the exposure picture angle.

Next, an embodiment of device manufacturing method which uses an X-ray exposure apparatus such as described above, will be explained.

Figure 6:
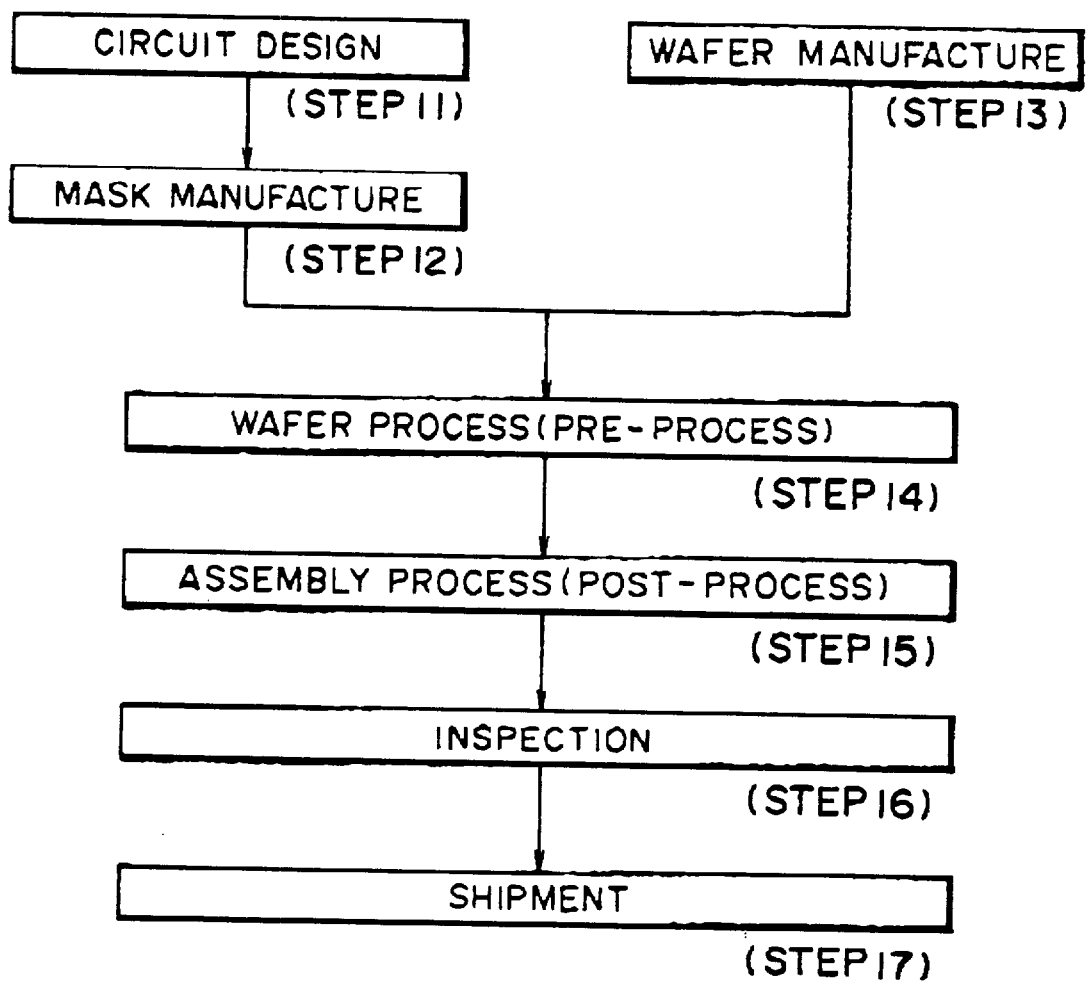
FIG. 6 is a flow chart of semiconductor device manufacturing processes.

FIG. 6 is a flow chart of procedure for manufacture of microdevices such as semiconductor chips (e.g. ICs or LSIs), liquid crystal panels, CCDs; thin film magnetic heads or micro-machines, for example. Step 11 is a design process for designing a circuit of a semiconductor device. Step 12 is a process for making a mask on the basis of the circuit pattern design. Step 13 is a process for preparing a wafer by using a material such as silicon. Step 14 is a wafer process which is called a pre-process wherein, by using the so prepared mask and wafer, circuits are practically formed on the wafer through lithography. Step 1z5 subsequent to this is an assembling step which is called a post-process wherein the wafer having been processed by step 14 is formed into semiconductor chips. This step includes assembling (dicing and bonding) process and packaging (chip sealing) process. Step 16 is an inspection step wherein operation check, durability check and so on for the semiconductor devices provided by step 15, are carried out. With these processes, semiconductor devices are completed and they are shipped (step 17).

Figure 7:
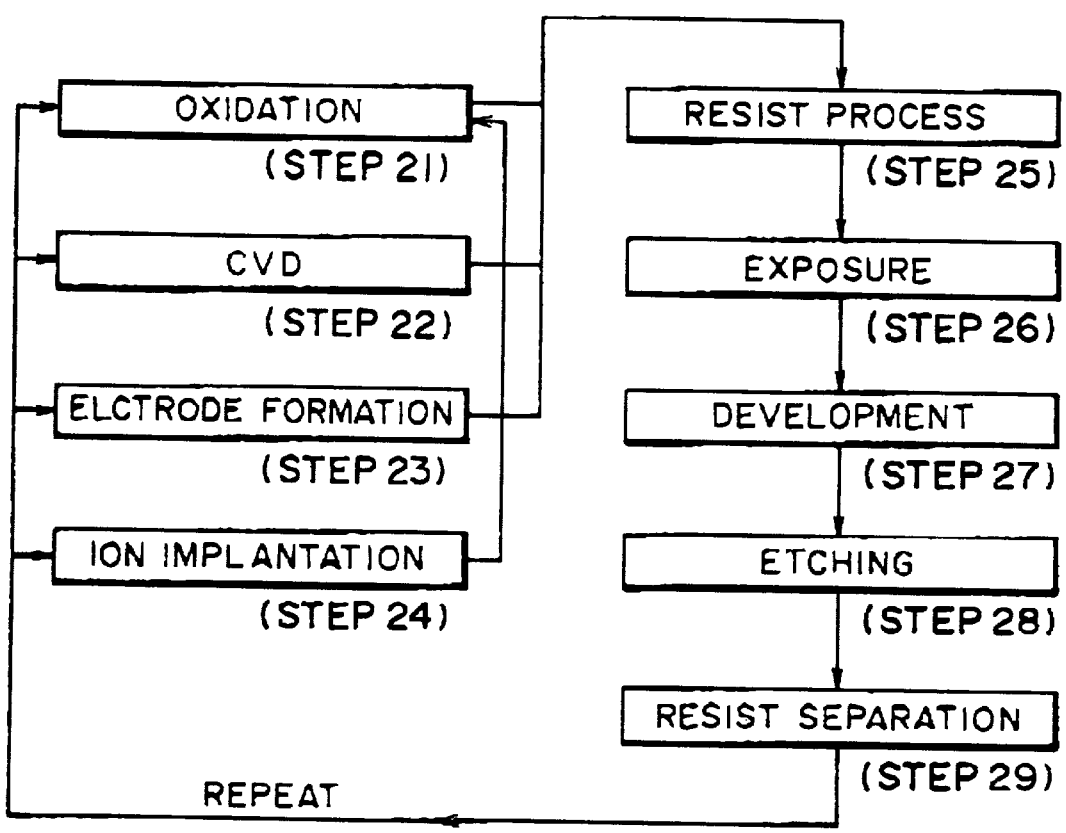
FIG. 7 is a flow chart of a wafer process.

FIG. 7 is a flow chart showing details of the wafer process. Step 21 is an oxidation process for oxidizing the surface of a wafer. Step 22 is a CVD process for forming an insulating film on the wafer surface. Step 23 is an electrode forming process for forming electrodes upon the wafer by vapor deposition. Step 24 is an ion implanting process for implanting ions to the wafer. Step 25 is a resist process for applying a resist (photosensitive material) to the wafer. Step 26 is an exposure process for printing, by exposure, the circuit pattern of the mask on the wafer through the exposure apparatus described above. Step 27 is a developing process for developing the exposed wafer. Step 28 is an etching process for removing portions other than the developed resist image. Step 29 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A synchrotron radiation measuring system for measuring synchrotron radiation from a synchrotron radiation ring, the synchrotron radiation having a beam profile with an intensity distribution that is variable in accordance with at least one of an accumulated current value and a vacuum level of the synchrotron radiation ring, said system comprising:

an X-ray detector movable in a direction of the intensity distribution of the synchrotron radiation in order to follow a shift of the synchrotron radiation, said X-ray detector detecting the synchrotron radiation and outputting a signal based on the detected synchrotron radiation; and computing means for computing an intensity of the synchrotron radiation based on the signal of said X-ray detector and for reserving therein, taking into account variations of the intensity distribution of the synchrotron radiation due to a chance in the accumulated current value, one of (i) a relation between the signal of said X-ray detector and the intensity distribution of the synchrotron radiation and (ii) a relation among the signal of said X-ray detector, the vacuum level, and the intensity distribution of the synchrotron radiation.

2. A system according to claim 1, wherein said computing means reserves therein a relation between a signal of said X-ray detector and the intensity distribution of synchrotron radiation, and wherein, when the intensity distribution of synchrotron radiation is I and the output of said X-ray detector is v, the relation satisfies a condition:

$$I(v) = a_0 + a_1 v + a_2 v^2 + a_3 v^3 + \ldots$$

3. A system according to claim 1, wherein said computing means reserves therein a relation among a signal of said X-ray detector, the level of vacuum at the synchrotron ring and the intensity of synchrotron radiation, and wherein, when the intensity of synchrotron radiation is I and the output of said X-ray detector is v, the relation satisfies a condition:

$$I(v) = a_0(p) + a_1(p)v + a_2(p)v^2 + a_3(p)v^3 + \ldots$$

where $a_0, a_1, a_3, \ldots$, are coefficients which are a function of vacuum level p of the synchrotron ring.

4. A system according to claim 1, wherein said X-ray detector has two elements which are disposed in array along the direction of intensity distribution of the synchrotron radiation.

5. An X-ray exposure apparatus, comprising:

a synchrotron radiation intensity measuring system as recited in any one of claims 1–4; and control means for controlling exposure amount on the basis of measurement by said measuring system.

6. An apparatus according to claim 5, wherein said control means comprises means for controlling exposure time.

7. An apparatus according to claim 6, wherein said exposure time controlling means comprises shutter control means for controlling a driving speed or a driving pattern for a shutter thereby to control the exposure time.

8. A device manufacturing method comprising the steps of:

preparing an X-ray exposure apparatus as recited in claim 5; and performing an exposure process by use of the X-ray exposure apparatus.

\* \* \* \* \*

UNITED STATES PATENT AND TRADEMARK OFFICE
CERTIFICATE OF CORRECTION

PATENT NO. : 6,160,865
DATED : December 12, 2000
INVENTOR(S) : Nobuaki Ogushi

Page 1 of 1

It is certified that error appears in the above-identified patent and that said Letters Patent is hereby corrected as shown below:

Column 1,
Line 28, "can" should read -- can- --.
Line 40, "are" should read -- is --.

Column 2,
Line 5, "intensity" should read -- intensity distribution --.
Line 28, "$a_1, a_3,$" should read -- $a_1, a_2, a_3,$ --.

Column 3,
Line 41, "stutter" should read -- shutter --.

Column 4,
Line 20, "can not" should read -- cannot --.
Line 61, "corresponds to " should read -- is --.

Column 5,
Line 46, "or curse" should read -- of course --.

Column 6,
Line 47, "chance" should read -- change --.
Line 65, "intensity" should read -- intensity distribution --.

Signed and Sealed this

Sixteenth Day of October, 2001

Attest:

NICHOLAS P. GODICI
*Attesting Officer*   *Acting Director of the United States Patent and Trademark Office*